(12) United States Patent
Denison et al.

(10) Patent No.: US 7,253,474 B2
(45) Date of Patent: Aug. 7, 2007

(54) QUASI-VERTICAL SEMICONDUCTOR COMPONENT

(75) Inventors: Marie Denison, München (DE); Hannes Estl, Klagenfurt (AT)

(73) Assignee: Infineon Technologies AG, Munich (DE)

( * ) Notice: Subject to any disclaimer, the term of this patent is extended or adjusted under 35 U.S.C. 154(b) by 492 days.

(21) Appl. No.: 10/667,629

(22) Filed: Sep. 22, 2003

(65) Prior Publication Data

US 2004/0108567 A1 Jun. 10, 2004

(30) Foreign Application Priority Data

Sep. 20, 2002 (DE) .............................. 102 43 743

(51) Int. Cl.
*H01L 27/01* (2006.01)
(52) U.S. Cl. ...................... 257/341; 257/339; 257/401
(58) Field of Classification Search ................ 257/500, 257/129, 168, 335, 336, 339, 483, 341, 401, 257/342, 487
See application file for complete search history.

(56) References Cited

U.S. PATENT DOCUMENTS

| | | | |
|---|---|---|---|
| 5,589,405 A * | 12/1996 | Contiero et al. ............. 438/268 |
| 5,635,742 A | 6/1997 | Hoshi et al. |
| 5,672,528 A | 9/1997 | Disney et al. |
| 6,049,108 A * | 4/2000 | Williams et al. ............ 257/341 |
| 6,657,255 B2 * | 12/2003 | Hshieh et al. ............... 257/330 |

OTHER PUBLICATIONS

Murari, B. et al. (Eds.): "Smart Power ICs—Technologies and Applications", Springer Verlag, p. 20, pp. 20 and 32-36, Jun. 13, 2002.

* cited by examiner

*Primary Examiner*—Phat X. Cao
*Assistant Examiner*—Abul Kalam
(74) *Attorney, Agent, or Firm*—Laurence A. Greenberg; Werner H. Stemer; Ralph E. Locher

(57) ABSTRACT

A quasi-vertical semiconductor component in which, by variation of the layout, the process or the wiring of inner cells, a compensation for a voltage drop along a buried layer is provided in order thus to ensure a similar operating point of the individual inner cells in the well. Therefore, the disadvantages brought about by a voltage drop in the buried layer are ultimately overcome.

7 Claims, 5 Drawing Sheets

QUASI-VERTICAL SEMICONDUCTOR COMPONENT

BACKGROUND OF THE INVENTION

Field of the Invention

The present invention relates to a quasi-vertical semiconductor component having at least two inner cells disposed in a well, a buried layer provided between the well and a semiconductor substrate, and a sinker zone ("terminal zone" for the buried layer), which connects the buried layer to a surface of the semiconductor component.

A quasi-vertical semiconductor component of this type is described for example in the reference by B. Murari et al., titled "Smart Power ICs", Springer, pages 20 and 32 to 36.

The basic construction of a conventional quasi-vertical semiconductor component of this type is illustrated in a sectional illustration in FIG. 5. The semiconductor component may be, by way of example, a diode, a vertical DMOS transistor, a bipolar transistor or a thyristor.

In all these cases, the quasi-vertical semiconductor component has, for example, a p-conducting semiconductor substrate 1 made of silicon and an n-conducting semiconductor layer 2 likewise made of silicon, for example, provided on the substrate 1. In this case, the semiconductor layer 2 can be applied to the semiconductor substrate 1 by epitaxy.

Situated between the semiconductor substrate 1 and the semiconductor layer 2 is an $n^+$-conducting buried layer 3, which is connected via a likewise $n^+$-conducting sinker zone 4 to a surface of the semiconductor component at which an $n^{++}$-conducting terminal zone 5 with a sinker terminal 6 is provided. In general, for the sinker zone 4 it is possible to use any type of conducting connection between the buried layer 3 and the surface, such as, for example, a trench filled with doped polycrystalline silicon.

With the buried layer 3 and the sinker zone 4, which is configured in an annular fashion, if appropriate, a common n-conducting well 7 is formed in the semiconductor layer 2, the well 7 containing various inner cells 8 which are connected in parallel with one another via a common terminal 9.

An edge termination 10 provides for a dielectric strength between the last inner cell 8 and the sinker zone 4 that does not form a limitation for the component.

The edge termination 10 may contain a suitable combination of diffusions in the well 7, an insulation layer containing, for example, silicon dioxide and/or silicon nitride and a field plate (e.g. made of metal or polysilicon) lying above the insulation layer.

Depending on the type or construction of the inner cells 8, the quasi-vertical semiconductor component illustrated is a diode, a vertical DMOS transistor, a bipolar transistor or a thyristor.

It should be noted at this point that the conductivity types specified here and below are only examples. It is thus possible, of course, to provide the conductivity types in opposite fashion, that is to say, by way of example, to replace the n conductivity type with the p conductivity type and vice-versa. Equally, it is possible to use any suitable semiconductor material such as, in particular, silicon, silicon carbide, etc. for the quasi-vertical semiconductor component.

FIG. 6 shows, as a first concrete example for the semiconductor component of FIG. 5, the construction of a quasi-vertical up-drain DMOS transistor, that is to say of a DMOS transistor whose drain terminal does not lie on the rear side of the substrate as in the case of a vertical structure, but rather on the same side as a gate terminal and a source terminal or a body terminal. In this case, the inner cells 8 contain a p-conducting body zone 11 and an n-conducting source zone 12, it being possible to provide the body zone 11 and the source zone 12 with a common contact 13.

The individual source zones 12 of the various inner cells 8 may be produced by diffusion and run parallel to drain from sinker zone 4, buried layer 3 and well 7. However a polygonal configuration of the respective inner cells 8 is also possible.

Situated between the individual source zones 12 are gate electrodes 14 on a non-illustrated gate oxide.

The current from the source zones 12 flows via the channels formed beneath the gate electrodes 14 in the body zones 11 into the common well 7 and from the latter to the buried layer 3, from where the current flows further via the sinker zone 4 and the terminal zone 5 into the sinker terminal 6 forming a drain terminal.

If, in the example of FIG. 6, the gate electrodes 14 are omitted and the terminals for the body zones 11 and the source zones 12 are led out separately, then a bipolar transistor is produced, as is illustrated in FIG. 7, where it has a common p-conducting base zone 15 with $p^+$-conducting base terminal zones 16 and also n-conducting emitter zones 17 embedded in the base zone 15. The base zones 16 and the emitter zones 17 in the common well 7 are respectively connected together in this case. The sinker terminal 6 forms a collector terminal in the bipolar transistor.

FIG. 8 shows, in a simplified illustration, an impedance network which corresponds to the examples of FIGS. 5 to 7 and reveals how the buried layer 3 causes a voltage drop on account of its internal resistance with resistances R1, R2, R3, . . . between the individual inner cells 8. Moreover, if appropriate there may be a gradient in the RC constant of the respective body-drain diodes of the individual inner cells 8 from outside, that is to say from the sinker zone 4 inward to the cell. This gradient in the RC constant, that is to say in the admittance Y (R, C)=1/Z (Z=impedance) is illustrated diagrammatically by the individual imaginary resistances in FIG. 8. In the case of a high current density or rapid voltage changes, it becomes apparent to a greater extent, the more inner cells 8 lie parallel to one another in the well 7 and the higher the resistance of or the lower the doping of the buried layer 3.

In the case of a quasi-vertical semiconductor component of the type outlined above, what are critical are primarily operating points for which the power loss is high and in which the current i at a common terminal 18 is greatly dependent on the voltage u present at the sinker terminal 6.

It is, then, typically the case for reverse-biased or avalanche operation of all types of quasi-vertical semiconductor components that in the latter the sinker voltage u in the case of a specific avalanche or reverse current i2 abruptly falls or "snaps back" to a low voltage. This is also referred to as "snap-back". The snap-back is undesirable for many semiconductor components and limits their safe operating area. For other semiconductor components, such as ESD protection structures (ESD=ElectroStatic Discharge), for example, the snap-back is desirable, which usually holds true only in the event of optimum utilization of the available area.

It is desirable in both cases above, however, for the power loss to be distributed uniformly over the area of the inner cells 8 in the well 7 and for all the inner cells 8 to trigger to their "avalanche characteristic curve" under an identical or at least similar operating point.

FIG. 9A, which illustrates the forward current i1 of a semiconductor component having inner cells 1 to N as a function of the sinker voltage u, and FIG. 9B, which shows the dependence of the reverse current i2 of the semiconductor component as a function of the sinker voltage u of the semiconductor component, then reveal that the individual inner cells 8 (the cell 1 designates a cell located the nearest to the sinker zone 4, while the zone N/2 indicates a cell in the center of the well 7), have very different operating points, the position of these operating points depending on the distance between the respective inner cells 8 and the sinker zone 4. In this case, the first cell (cell 1), which reaches its trigger current with respect to a snap-back (in this respect, see especially FIG. 9B), limits the strength of the semiconductor component overall.

A further cause of why a gradient in the current yield of the individual inner cells 8 lying parallel to one another may be undesirable could possibly lie in the complex scalability of the current properties of the semiconductor component with the number of inner cells thereof, which in turn results from the voltage drop in the buried layer 3.

Therefore, a fundamental problem in quasi-vertical semiconductor components is that the operating points of the inner cells are greatly dependent on the sinker voltage u and the inner cells are therefore at different operating points depending on their distance from the sinker zone 4. This results in a non-optimum utilization of the available semiconductor area in cases of a high power loss such as at the breakdown of the semiconductor component.

SUMMARY OF THE INVENTION

It is accordingly an object of the invention to provide a quasi-vertical semiconductor component that overcomes the above-mentioned disadvantages of the prior art devices of this general type, in which the disadvantages brought about by a voltage drop in the buried layer are ultimately overcome.

With the foregoing and other objects in view there is provided, in accordance with the invention, a quasi-vertical semiconductor component. The component contains a surface, a semiconductor substrate, a well, at least two inner cells disposed in the well and having a substantially similar operating point, thereby compensating for differences between the inner cells, a buried layer disposed between the well and the semiconductor substrate, and a sinker zone connecting the buried layer to the surface of the semiconductor component.

In the case of a quasi-vertical semiconductor component of the type mentioned in the introduction, the object is achieved according to the invention by virtue of the fact that the inner cells have an essentially similar operating point, thereby compensating for differences between the inner cells.

In other words, in the case of the quasi-vertical semiconductor component according to the invention, corresponding measures ensure that the inner cells of the semiconductor components are at a similar operating point in the largest possible part of their operating range. The differences may generally be compensated for for example by variation of the structure of the inner cells by processing, wiring, layout, etc. This variation can thus compensate for differences between the inner cells caused by the buried layer, if appropriate depending on the sinker voltage.

Thus, what is essential to the quasi-vertical semiconductor component according to the invention is that a voltage gradient—generated by the buried layer—between the inner cells that lie parallel to one another is compensated for by providing for corresponding compensation in the inner cells. What is thereby achieved is that all the inner cells in the well of the semiconductor component, at a specific sinker voltage, are at a similar operating point for the forward current i1 or the reverse current i2. For this purpose, a "gradient" is built into the individual inner cells, the gradient specifically being brought about for example by width and/or grid of the inner cells or by the wiring or by special process measures, such as additional diffusions.

In accordance with an added feature of the invention, the inner cells have a given width and a given radius of curvature, and the substantially similar operating point of the inner cells is set by varying the given width, the given radius of curvature and/or a grid configuration of the inner cells.

In accordance with an additional feature of the invention, the inner cells have body zones with a given width and a given radius of curvature, and that the given width of the body zones, the given radius of curvature of the body zones, and/or a grid configuration of the body zones of the inner cells is varied.

In accordance with a further feature of the invention, the body zones are wider or have a larger radius of curvature in a vicinity of the sinker zone than at a distance from the sinker zone.

In accordance with another feature of the invention, the grid configuration of the inner cells has a larger spacing distance at a distance from the sinker zone than in a vicinity of the sinker zone.

In accordance with another added feature of the invention, doped regions are disposed in the well. A variation of the given width, the given radius of curvature and/or the grid configuration of the inner zones are effected by the doped regions. Preferably, the doped regions are introduced by high-energy ion implantation and lie between the well and the body zone of the inner cells.

In accordance with a concomitant feature of the invention, the well has an edge region and the sinker zone is disposed at the edge region.

Other features which are considered as characteristic for the invention are set forth in the appended claims.

Although the invention is illustrated and described herein as embodied in a quasi-vertical semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
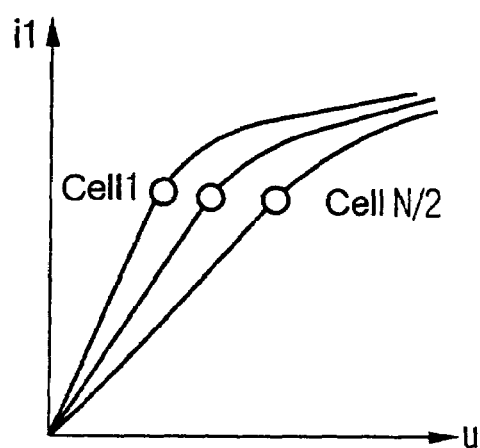
FIG. 1A is a graph showing a dependency of a forward current on a sinker voltage in a quasi-vertical semiconductor component according to the invention.
Figure 1B:
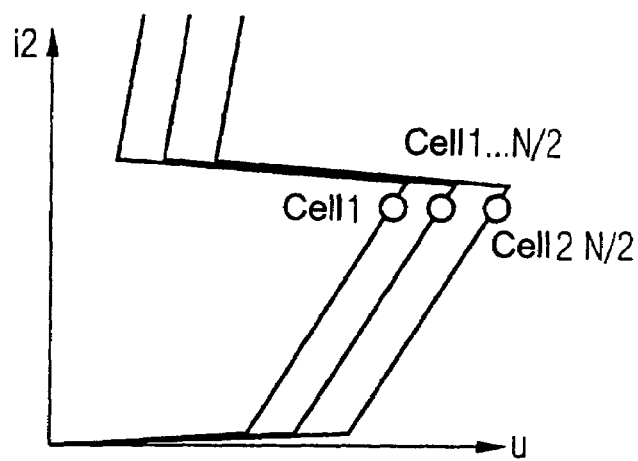
FIG. 1B is a graph showing a dependency of a reverse current on the sinker voltage in the quasi-vertical semiconductor component according to the invention.
Figure 9A:
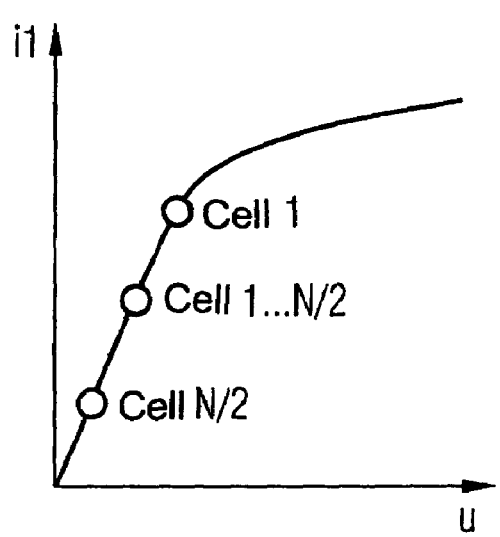
FIG. 9A is a graph showing a dependency of the forward current on the sinker voltage in a conventional quasi-vertical semiconductor component.
Figure 9B:
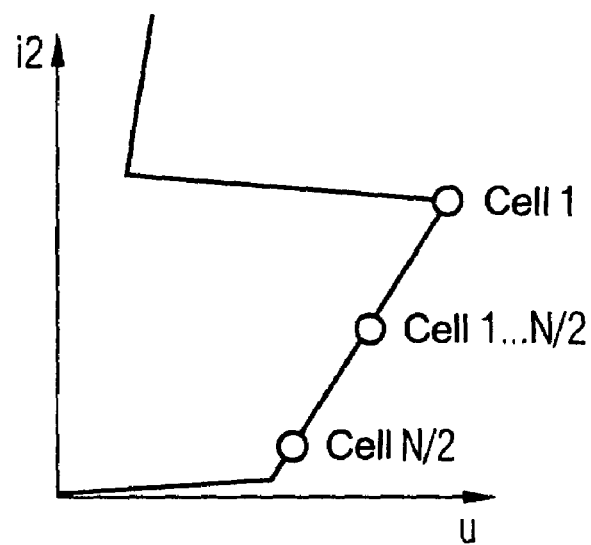
FIG. 9B is a graph showing the dependency of the reverse current on the sinker voltage in a conventional quasi-vertical semiconductor component.

In all the figures, the same reference symbols are used in each case for mutually corresponding structural parts. Referring now to the figures of the drawing in detail and first, particularly, to FIG. 1A thereof, there is shown a quasi-vertical semiconductor component according to the invention, in which the consequences brought about by the voltage drop that occurs in the buried layer on account of the resistance thereof are ultimately compensated for. In other words, a "gradient"—brought about by the voltage drop—between the individual inner cells of the semiconductor component is compensated for. As a consequence of the compensation, all the inner cells have an essentially similar operating point independently of the sinker voltage, as is shown in FIGS. 1A and 1B. Thus, FIG. 1A shows the dependence of a forward current i1 as a function of a sinker voltage u, while FIG. 1B illustrates the dependence of a reverse current i2 as a function of the sinker voltage u. As can be seen from FIGS. 1A and 1B, in the semiconductor component according to the invention, practically the same values for the forward current i1 (see FIG. 1A) and, respectively, for the reverse current i2 (see FIG. 1B) are present from the inner cell 1 in the vicinity of the sinker zone up to the inner cell N/2 in the center of the well 7, with the result that a variation of the operating points as in the existing semiconductor components, as was explained with reference to FIGS. 9A and 9B, no longer occurs. In other words, in the quasi-vertical semiconductor component according to the invention, the forward current i1 or the reverse current i2 always has substantially the same constant value independently of the position of the inner cell at the edge or in the center of the well 7 as a function of the sinker voltage u.

Figure 2:
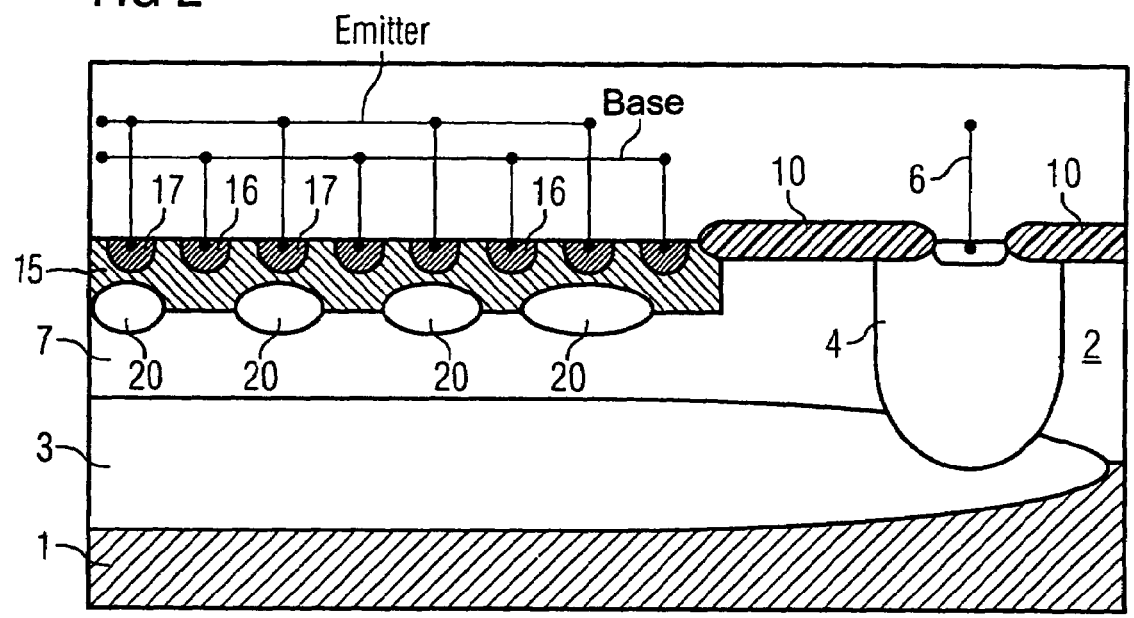
FIG. 2 is a diagrammatic, sectional view of a base region of a bipolar transistor as a first exemplary embodiment of the quasi-vertical semiconductor component according to the invention.
Figure 3:
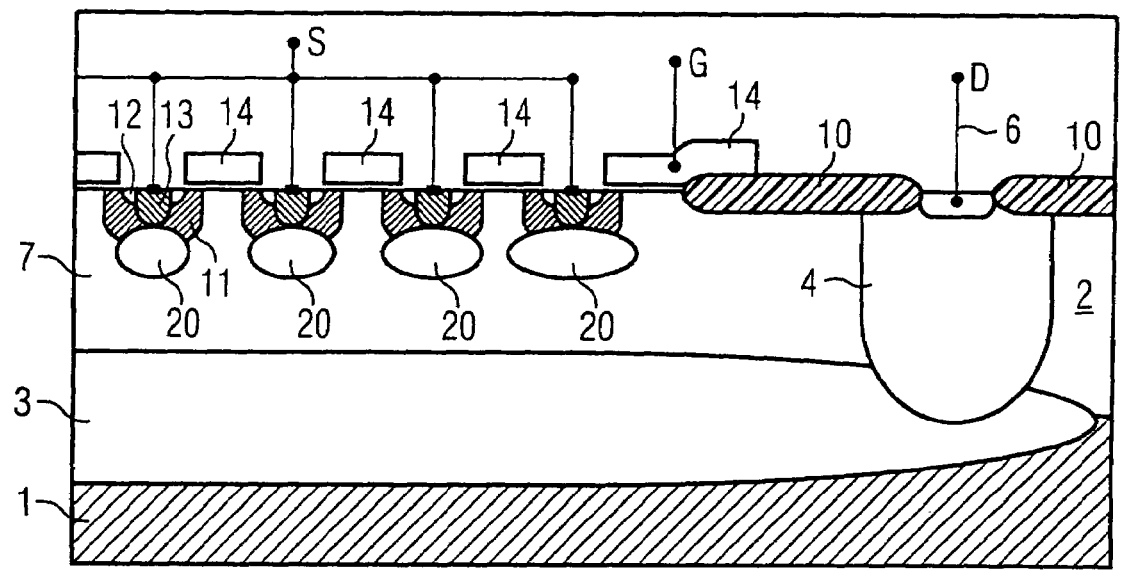
FIG. 3 is a sectional view of a source cell array of an up-drain DMOS transistor as a second exemplary embodiment of the semiconductor component according to the invention.
Figure 4:
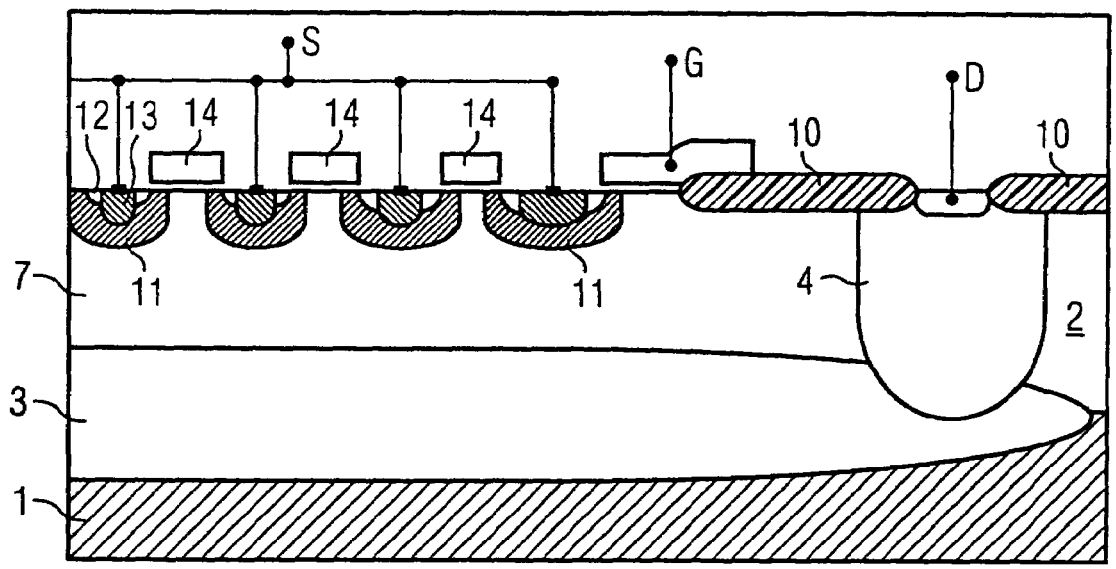
FIG. 4 is a sectional view of the source cell array of an up-drain DMOS transistor as a third exemplary embodiment of the quasi-vertical semiconductor component according to the invention.
Figure 5:
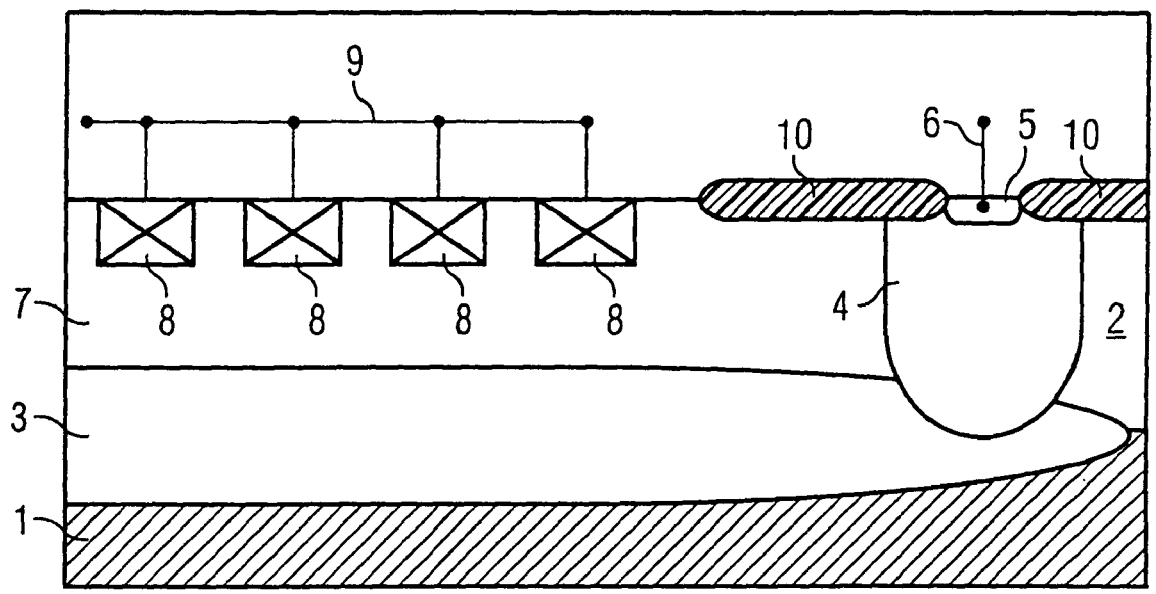
FIG. 5 is a sectional view for elucidating the general construction of a quasi-vertical semiconductor component.

FIGS. 2 to 4 then illustrate concrete exemplary embodiments of the quasi-vertical semiconductor component according to the invention, which illustrate in concrete terms how it is possible to ensure that the inner cells have an essentially similar operating point.

Figure 7:
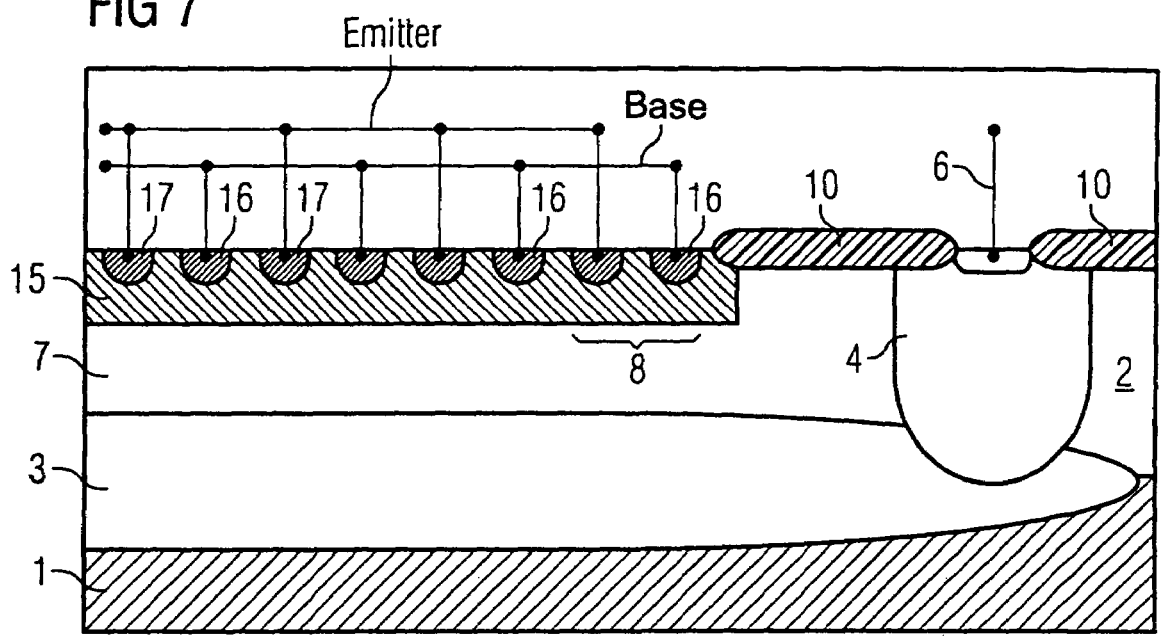
FIG. 7 is a sectional view of a conventional quasi-vertical bipolar transistor.
Figure 8:
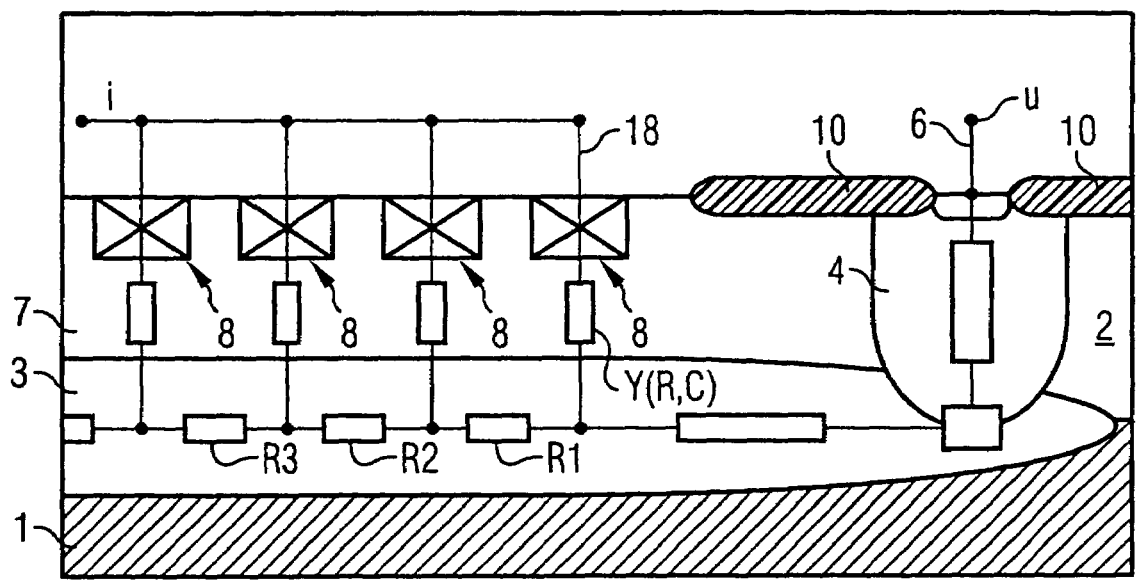
FIG. 8 is a sectional view of an impedance network in the case of a conventional quasi-vertical semiconductor component.

FIG. 2 illustrates a bipolar transistor as an exemplary embodiment of the quasi-vertical semiconductor component according to the invention. In the exemplary embodiment, a base-collector breakdown is varied with the aid of p-conducting zones 20 which are introduced by high-energy implantation, for example, and are provided in addition to the conventional bipolar transistor of FIG. 7 in the region of a pn junction between a base zone 15 and a well 7. The zones 20 are then configured or doped in such a way that larger radii of curvature are present at the edge of the well 7 than in the center thereof, so that what is achieved by the zones 20 for the inner cells 8 is that there is a gradient in the breakdown from "the inside toward the outside". In other words, the inherently lower voltage in the center of the buried layer 3, which voltage is brought about by the voltage drop in the buried layer 3, is compensated for in terms of its effect on the breakdown behavior in that here care is taken to ensure smaller radii of curvature of the pn junction between the base zone 15 and the well 7 than in the edge region of the well 7, in which the zones 20 have a larger radius of curvature, with the result that the larger voltage present which inherently leads rather to a breakdown is compensated for there by the larger radius of curvature of the pn junction. The fact that smaller radii of curvature provide for lower breakdown voltages is therefore exploited here.

Figure 6:
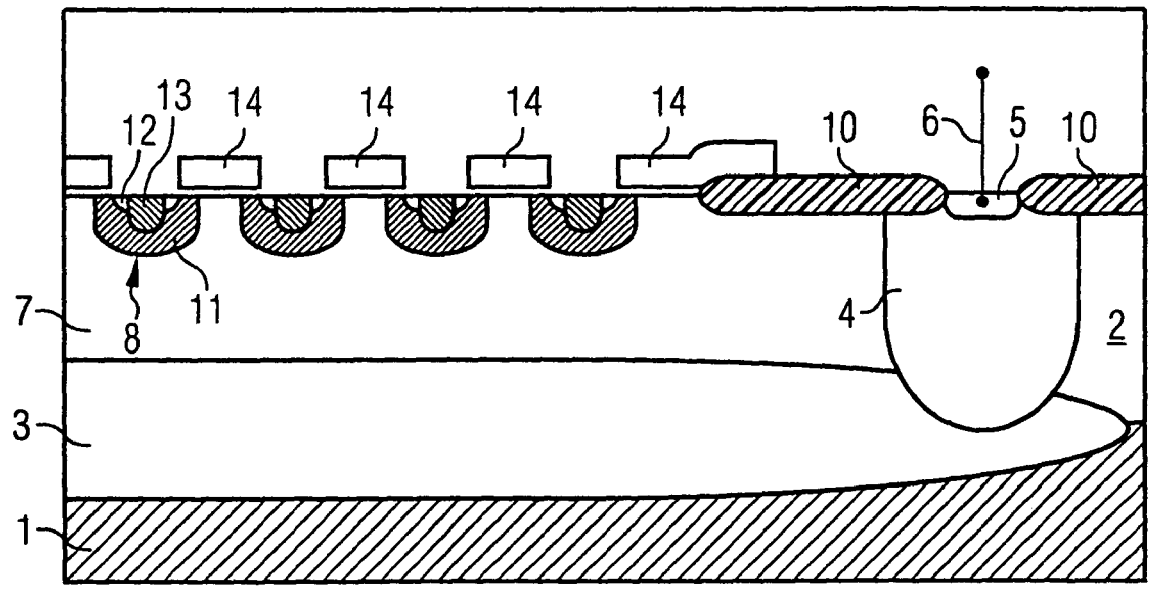
FIG. 6 is a sectional view of a conventional quasi-vertical up-drain DMOS transistor.

FIG. 3 shows a further exemplary embodiment of the semiconductor component according to the invention on the basis of an up-drain DMOS transistor, in which, in a manner similar to that in the exemplary embodiment of FIG. 2, the zones 20 which may be introduced by high-energy implantation compensate for the breakdown between the body zones 11 and the well 7 that forms part of the drain. The essential aspect of the present invention emerges immediately from a comparison of FIG. 3 with FIG. 6: in contrast to the conventional transistor, in the quasi-vertical semiconductor component according to the invention, the individual body zones 11 of the respective inner cells 8 have the zones 20 located beneath them, which zones, in a similar manner to that in the exemplary embodiment of FIG. 2 have a radius of curvature that changes from the outside inward, the radius of curvature, in this case as well, being larger at the edge of the well 7 than in the center thereof. What is achieved in this way, as in the exemplary embodiment of FIG. 2, is that the individual inner cells have a similar breakdown strength (latch-up strength).

Finally, FIG. 4 also shows a further exemplary embodiment of the semiconductor component according to the invention in the form of an up-drain DMOS transistor in which an effect comparable to the exemplary embodiments of FIGS. 2 and 3 is obtained by varying the width of the individual body zones 11 and the grid thereof. In other words, in the exemplary embodiment of FIG. 4, the body zones 11 located at the edge of the well 7 have a larger radius of curvature than the body zones 11 in the center of the well 7, and, moreover, the body zones 11 are disposed closer together at the edge of the well 7 than in the center of the well 7. This also has the effect that the pn junction structure has larger radii of curvature in the region of higher voltages of the buried layer 3, that is to say is ultimately flatter than in the central region of the well 7.

The invention thus for the first time enables the possibility of providing for compensation of the voltage drop along a buried layer by targeted variation of the configuration of the pn junction between body zones and well. This results in a considerable improvement especially in the breakdown properties of a semiconductor component configured according to the invention.

We claim:

1. A quasi-vertical semiconductor component, comprising:
   a surface;
   a semiconductor substrate;
   a well;
   at least three inner cells disposed in said well;
   a buried layer disposed between said well and said semiconductor substrate;
   a sinker zone disposed outside a region of said inner cells and to which a sinker voltage is applied, said sinker zone connecting said buried layer to said surface of the semiconductor component; and
   said inner cells having substantially similar values for forward currents and reverse currents being independent of a positional relationship to said sinker zone by making a spacing distance between said inner cells which are disposed farther away from said sinker zone larger than a spacing distance between said inner cells which are disposed closer to said sinker zone.

2. The semiconductor component according to claim 1, wherein said inner cells have body zones with a given width and a given radius of curvature, and a spacing between said body zones of said inner cells is varied.

3. The semiconductor component according to claim 2, wherein said body zones which are disposed closer to said sinker zone have a larger width and/or a larger radius of curvature than said body zones which are disposed farther away from said sinker zone.

4. The semiconductor component according to claim 1, further comprising doped regions disposed in said well, a variation of said spacing between said inner cells is effected by said doped regions.

5. The semiconductor component according to claim 4, wherein said doped regions, are introduced by high-energy ion implantation.

6. The semiconductor component according to claim 5, wherein said doped regions lie between said well and said body zone of said inner cells.

7. The semiconductor component according to claim 1, wherein said well has an edge region and said sinker zone is disposed at said edge region.

* * * * *